United States Patent [19]

Weidman

[11] Patent Number: 5,144,268
[45] Date of Patent: Sep. 1, 1992

[54] BANDPASS FILTER UTILIZING CAPACITIVELY COUPLED STEPPED IMPEDANCE RESONATORS

[75] Inventor: John H. Weidman, Chandler, Ariz.

[73] Assignee: Motorola, Inc., Schaumburg, Ill.

[21] Appl. No.: 722,397

[22] Filed: Jun. 20, 1991

Related U.S. Application Data

[63] Continuation of Ser. No. 382,045, Jul. 18, 1989, abandoned, which is a continuation-in-part of Ser. No. 132,756, Dec. 14, 1987, abandoned.

[51] Int. Cl.$^5$ ............................................ H01P 1/203
[52] U.S. Cl. ...................................... 333/204; 333/219
[58] Field of Search ............................... 353/202–208, 353/245, 246, 222, 219, 235, 220, 221, 167, 175, 176

[56] References Cited

U.S. PATENT DOCUMENTS

| | | | |
|---|---|---|---|
| 2,201,326 | 5/1940 | Trevor | 333/202 |
| 2,915,716 | 12/1959 | Hattersley | 333/204 |
| 3,451,015 | 6/1969 | Heath | 333/204 X |
| 4,506,241 | 3/1985 | Makimoto et al. | 333/222 |
| 4,733,208 | 3/1988 | Ishikawa et al. | 333/202 |

FOREIGN PATENT DOCUMENTS

| | | | |
|---|---|---|---|
| 0019404 | 1/1984 | Japan | 333/207 |
| 0125102 | 7/1984 | Japan | 333/204 |
| 0114001 | 6/1985 | Japan | 333/206 |
| 0246101 | 12/1985 | Japan | 333/204 |

OTHER PUBLICATIONS

Matthaei et al., "Design of Microwave Filters . . . Coupling Structures", vol. 1, Aug. 5, 1963, pp. 423–430.
Sagawa et al., "A Design Method of Bandpass Filters Using Dielectric-Filled Coaxial Resonators", IEEE Transactions on Microwave Theory and Techniques, vol. MTT-33, No. 2, Feb. 1985, pp. 152–157.
Chen Y. Ho et al.–"Half-Wavelength and Step Impedance Resonators Aid Microstrip Filter Design", Microwave System Design News, Oct., 1983; pp. 83–103.
M. Makimoto et al.–"Bandpass Filters Using Parallel Coupled Stripline Stepped Impedance Resonators", IEEE Trans. on Microwave Theory and Tecnhiques, vol. MTT-28, No. 12, Dec. 1980; pp. 1413–1417.
M. Makimoto et al.–"Compact Bandpass Filters Using Stepped Impedance Resonators", Proceedings of the IEEE, vol. 67, No. 1, Jan. 1979; pp. 16–19.
Watkins et al.–"Narrow Band Butterworth or Chebyshev Filter Design Using the TE-59 Calculator", R.F. Design, Nov./Dec. 1980; 7 pages.

*Primary Examiner*—Eugene R. Laroche
*Assistant Examiner*—Seung Ham
*Attorney, Agent, or Firm*—Frank J. Bogacz

[57] ABSTRACT

A bandpass filter which lends itself to applications in the 500 megahertz to 1 gigahertz region. The filter utilizes the capacitively coupled bandpass filter as a model in the design process, but replaces the lumped element inductor/capacitor resonators with distributed stepped impedance resonators.

1 Claim, 1 Drawing Sheet

BANDPASS FILTER UTILIZING CAPACITIVELY COUPLED STEPPED IMPEDANCE RESONATORS

This applicatin is a continuation of prior application Ser. No. 382,045, filed Jul. 18, 1989, now abandoned, which is a continuation-in-part of prior application Ser. No. 07/132,756, filed Dec. 14, 1987, now abandoned.

BACKGROUND OF THE INVENTION

The present invention pertains to a bandpass filter and more specifically to a capacitively coupled bandpass filter which is operable in the upper UHF region and which utilizes stepped impedance resonators.

The design of bandpass filters in the UHF region requires numerous tradeoffs with respect to circuit topology, bandwidth, element realization, allowable insertion loss, etc. before a design is arrived at that will satisfy all of the desired constraints. In many cases, the design of a conventional filter is driven by the realizable range of inductor values for the frequency range of interest. In the case of wide band or narrow band bandpass filter designs, the required values of the inductors and capacitors diverge rather quickly from the case of the standard low pass to bandpass transformation, which ends up with a series LC, shunt LC configuration. A well-known technique to handle the narrow band bandpass filter designs is the capacitively coupled bandpass filter which introduces a number of redundant elements such that all components can be maintained well within their realizable ranges. The approach is well suited for bandwidths less than about 20% of center frequency and allows the designer the flexibility of choosing realizable inductor values to be used in the circuit. An example of a prior art capacitively coupled bandpass filter using shunt LC resonator elements is disclosed in Watkins, LR, "Narrow band Butterworth or Chebyshev Filter Using the TI-59 Calculator," RF Design, Nov./Dec. 1980, pp. 22–32.

However, a problem arises in the upper UHF region (greater than around 500 megahertz) with respect to the lumped inductor values While realizable values can be chosen, implementation becomes very difficult. When values are chosen that make it possible to construct inductors, air core inductors are warranted and a considerable amount of adjustment is normally required to obtain the desired performance. This, in turn, drives up the cost of the associated filter Additionally, the parasitic elements inherently present in a lumped element filter realization, due to board capacitance or non-ideal components, are hard to account for, and in many cases result in a filter with less than optimum performance, especially in the area of out-of-band rejection or isolation. Self-resonance of the lumped element components also causes spurious responses to occur at various frequencies outside the passband, thus limiting the frequency of spurious free operation. The frequency of the spurious responses is also very hard to predict. In addition, lumped element filters exhibit crosstalk between components. This crosstalk results in lower achievable isolation. While methods are available to improve isolation for lumped element filters, such as walls between components, such methods are somewhat expensive and time consuming.

A stepped impedance resonator (SIR) element is known to those skilled in the art. An example of a prior art comb-line filter using stepped impedance resonators is disclosed in Makimoto, M. and Yamashita, S. "Compact Bandpass Filters Using Stepped Impedance Resonators." Proceedings of the IEEE, Vol. 67, No. 1, Jan. 1979, pp. 16–19. This article describes the use of the SIR element in a comb-line filter and is based on cavity techniques. The comb-line filter using SIR elements in the Makimoto article, if it were done using printed circuit techniques, would be limited to very narrow band filters due to the distributed element coupling that is utilized. An additional problem with distributed elements is that a great deal of space is used.

SUMMARY OF THE INVENTION

In view of the foregoing, it is therefore an object of the present invention to provide an improved capacitively coupled bandpass filter.

Another object of the present invention is to provide a capacitively coupled bandpass filter using printed circuitry for the majority of the filter elements, thus reducing cost A further object of the present invention is to reduce parasitic element effects associated with the board layout.

Another object of the present invention is to produce a filter with a very predictable spurious response which can be controlled by the designer.

Another object of the present invention is to provide a capacitively coupled bandpass filter which achieves excellent out-of-band rejection.

These and other objects of the present invention will become apparent to those skilled in the art upon consideration of the accompanying specification, claims and drawings.

The foregoing objects are achieved in the present invention wherein the filter utilizes the capacitively coupled bandpass filter as a model in the design process, and replaces lumped element inductor/capacitor resonators with distributed stepped impedance resonators.

DESCRIPTION OF THE PREFERRED EMBODIMENT

Figure 1:
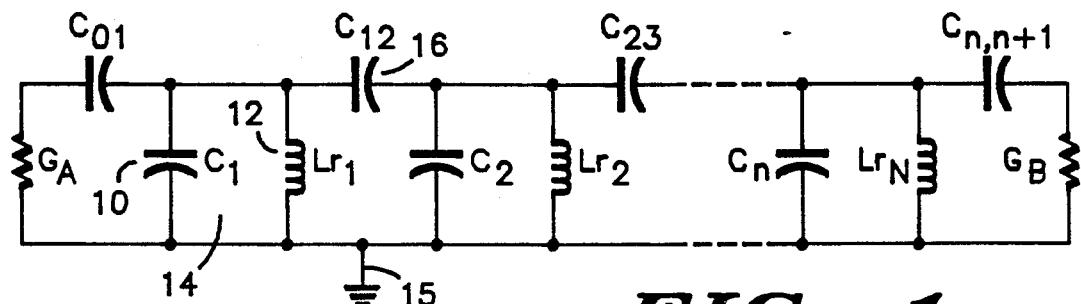
FIG. 1 illustrates a simplified prior art nth order capacitively coupled bandpass filter utilizing shunt LC resonator elements.

FIG. 1 is a schematic diagram of a model of a known capacitively coupled type bandpass filter. In the prior art this model is realized by using a plurality of capacitor 10 inductor 12 pairs. Each pair is coupled in parallel to form a shunt LC resonator 14. The plurality of shunt LC resonators 14 are coupled in series and separated by capacitors 16. The shunt LC resonators 14 are each coupled to a terminal 15 which is adapted to receive a common potential such as ground. The following is a step-by-step design procedure using the filter model illustrated in FIG. 1.

Design Procedure

Step 1. Obtain lowpass prototype element values; $g_{ii}$ based on bandpass filter requirements.

Step 2. Choose $L_{r1i} L_{r2i} \ldots, L_{rN}$.

It is pointed out that the $L_{r1}, L_{r2}, \ldots, L_{rN}$ values are values that are normalized to a center frequency of 1 rad/s and an impedance level of 1 ohm. These are related to the final element values by the following:

$$L_{ri} = \frac{L_{FINAL} (2\pi f_o)}{Z_o}$$

where $Z_o$ is the filter terminating impedance.

Step 3. Perform the following calculations:

$$Cr_i = \frac{1}{Lr_i} \quad \text{For } i = 1, \ldots, n$$

Step 4. Choose $G_A$ and $G_B$ admittances (usually $G_A = G_B = 1$).

Step 8. Calculate:

$$a' = \frac{f_2 - f_1}{f_o} = \text{FRACTIONAL BANDWIDTH}$$

$$(J_{01})^2 = \frac{a' Cr_1 G_A}{g_0 g_1}$$

$$(J_{n\,i\,n+1})^2 = \frac{a' Cr_1 G_B}{g_n g_{n+1}}$$

$$(J_{i,\,i+1})^2 = \frac{(a')^2 Cr_i Cr_{i+1}}{g_i g_{i+1}}$$

For $i = 1, \ldots, n-1$

Step 6. Calculate:

$$C01 = \frac{J_{01}}{\sqrt{1 - \left(\frac{J_{01}}{G_A}\right)^2}}$$

$$Cn,\,n+1 = \frac{J_{n,n+1}}{\sqrt{1 - \left(\frac{J_{n,n+1}}{G_B}\right)^2}}$$

$$Ci,\,i+1 = \sqrt{\frac{(a')^2 Cr_i Cr_{i+1}}{g_i g_{i+1}}}$$

For $i = 1, \ldots, n-1$

Step 7. Calculate:

$$C01^e = \frac{C_{01}}{1 + \left(\frac{C_{01}}{G_A}\right)^2}$$

$$C^e_{n,n+1} = \frac{C_{n,n+1}}{1 + \left[\frac{C_{n,n+1}}{G_B}\right]^2}$$

Step 8. Calculate:

$$C1 = Cr_1 - C_{01}{}^e - C_{12}$$

$$CN = Cr_n - C_{n,n+1}{}^e - C_{n-1,n}$$

$$Ci = Cr_i - C_{i-1,i} - C_{i,i+1} \quad \text{For } I = 2, \ldots, N-1$$

Step 9. The procedure above will give a band pass filter with a center frequency of 1 rad/s. Frequency scale components to the desired center frequency, and impedance scale to $Z_o$.

$$L \rightarrow \frac{Z_o L}{2\pi f_o}\,;\; C \rightarrow \frac{C}{Z_o 2\pi f_o}\,;\; R \rightarrow R Z_o$$

($f_o$ is in $H_z$)

Figure 2:
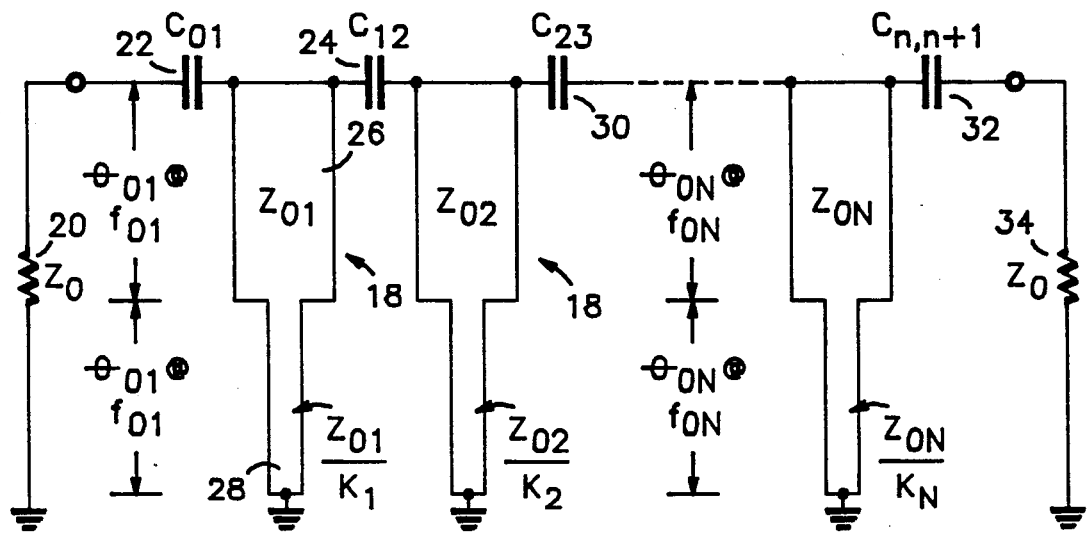
FIG. 2 illustrates a simplified diagram of an embodiment of the present invention.

FIG. 2 shows a simplified diagram of the present invention wherein stepped impedance resonators (SIR) 18 are used in the capacitively coupled type bandpass filter model and replace the shunt LC resonators 14 of FIG. 1 which are used in prior art. The embodiment illustrated in FIG. 2 has an admittance 20 having a first and second terminal. The first terminal of admittance 20 is coupled to a first terminal of a capacitor 22. The second terminal of admittance 20 is coupled to ground. The second terminal of capacitor 22 is coupled to a first terminal of a capacitor 24 and a first length of transmission line 26 from SIR 18. A second length of transmission line 28 from SIR 18, having a different impedance than the first length 26, is coupled in series with first length 26. Second length 28 is coupled to ground. A second terminal of capacitor 24 is coupled to a first terminal of a capacitor 30 and a second SIR 18. A plurality of stepped impedance resonators separated by capacitors may be used in this manner. A second terminal of a capacitor 32 is coupled to a first terminal of an admittance 34. A second terminal of admittance 34 is coupled to ground.

Figure 3:
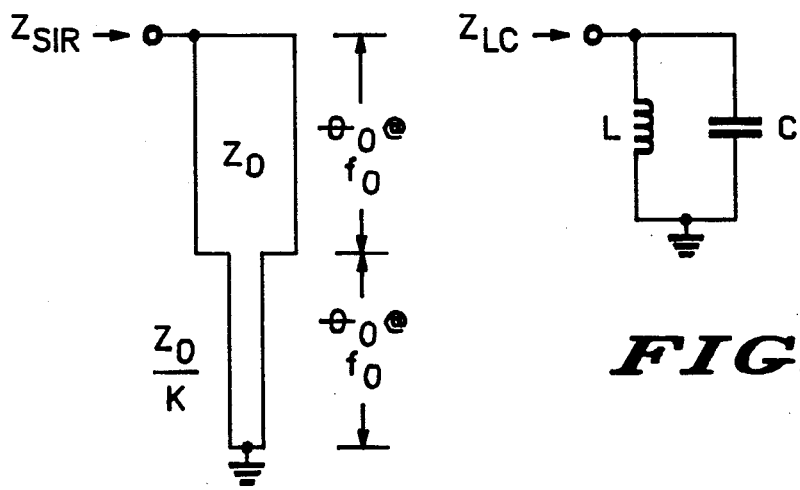
FIG. 3 illustrates a stepped impedance resonator equivalent to a shunt LC resonator element.

FIG. 3 illustrates an example of a stepped impedance resonator used in the preferred embodiment of the present invention. The SIR structure consists of two equal lengths of diverse impedance transmission lines connected in series and tied to ground. In this embodiment, the higher impedance transmission line is connected to ground. In order to replace the lumped element resonators in FIG. 1 with SIR elements, a relationship needs to be established between the two. There are numerous parameters that can be considered in establishing the relationship, however, not all solutions will give satisfactory results. Three possible solutions are listed below:

1. Equate the SIR and lumped element resonator resonant frequencies, $f_o$. Equate the susceptance slope parameters of the two resonators.
2. Equate the impedances of the SIR and the lumped element resonator at the filter's bandedges, $f_1$ and $f_2$.
3. Equate the SIR and lumped element resonator resonant frequencies, $f_o$. Equate the impedances of the SIR and lumped element resonator at the filters center frequency, $f_f$.

All three solutions were calculated and computer modeled. It was determined that the third solution yielded the best in-band return loss, thus it is the one utilized in the following design equations.

The admittance of the shunt LC resonator is given by the following:

$$Y = jWC + \frac{1}{jWL} \tag{1}$$

The input impedance of the SIR is given by the following:

$$Z_{SIR} = \frac{Z_{oj}\left(\frac{1}{K}+1\right)\tan\left(\theta o \frac{f}{f_o}\right)}{1 - \frac{1}{K}\left[\tan^2\left(\theta o \frac{f}{f_o}\right)\right]} \quad (2)$$

Equating the input admittances at the filter's center frequency, $f_f$, yields the following: (See FIG. 3)

$$Y_{SIR} = \frac{-j}{Z_o}\left(\frac{1 - \frac{1}{K}\tan^2\left(\frac{f_f}{f_o}\theta o\right)}{\left(\frac{1}{k}+1\right)\tan\left(\frac{f_f}{f_o}\theta o\right)}\right)$$

$$= Y_{LV} = -j\left(\frac{1}{2\pi f_f L} - 2\pi f_f C\right)$$

$$= -j\frac{2\pi C(f_o^2 - f_f^2)}{f_f}$$

solving for Zo yields the following:

$$Z_o = \frac{f_f}{2\pi C(f_o^2 - f_f^2)}\left[\frac{1 - \frac{1}{K}\tan^2\left(\frac{f_f}{f_o}\theta o\right)}{\left(\frac{1}{K}+1\right)\tan\left(\frac{f_f}{f_o}\theta o\right)}\right] \quad (3)$$

where $\theta o = \tan^{-1}\sqrt{K}$ = length at $f_o$ in radius
$F_f$ = filter's center frequency (chosen by designer)
$K$ = SIR impedance ration (chosen by designer)
$C$ = value of capacitance in lumped element resonator $$f_o = \frac{1}{2\pi\sqrt{LC}} = \text{resonant frequency of the resonators}$$

By utilizing equation 3 it is possible to equate a shunt LC resonator to a SIR with the constraints that they possess equal impedances at fo, the resonators resonant frequency, and $f_f$, the filer's center frequency.

Three examples of the present invention have been calculated and modeled.

EXAMPLE #1

546–574 MHz Filter (5.0% Bandwidth)

546-574 MHz BW used in design equations
N=4
0.044 dB Ripple

| Lumped element values calculated |
|---|
| $C01 = C_{45} = 1.98$ pf |
| $C12 = C_{34} = .525$ pf |
| $C23 = \phantom{xxx} = .403$ pr |
| $C_1 = C_4 = 9.25$ pf |
| $C_2 = C_3 = 10.6$ pf |
| $f01 = f_{04} = 625.5$ MHz |
| $f02 = f_{03} = 584.3$ MHz |
| $L_i = 7$ nH |
| $Z_o = 50$ ohms |

SIR Element values calculated $Ki = 0.33 \; \theta oi = 30°@f_{oi}$
$Z01 = Z_{04} = 14.1$ ohms
$Z02 = Z_{03} = 13.35$ ohms
$Ci, i+i$ same as the above

EXAMPLE #2

790–890 MHz filter (11.9% Bandwidth)

790-890 MHz used in design equations
0.044 dB Ripple

| Lumped Element values calculated |
|---|
| $C01 = C_{56} = 1.69$ pf |
| $C12 = C_{45} = .53$ pf |
| $C23 = C_{34} = .39$ pr |
| $C_1 = C_5 = 3.2$ pf |
| $C_2 = C_4 = 4.22$ pf |
| $C_3 = 4.37$ pf |
| $L_i = 7$ nH |
| $Z_o = 50$ ohms |
| $f01 = f_{05} = 1063.4$ MHz |
| $f02 = f_{04} = 926.0$ MHz |
| $f03 = 910.0$ MHz |

SIR Element values calculated $Ki = 0.5, \; \theta oi = 35.2°@f_{oi}$
$Z01 = Z_{05} = 27.4$ ohms
$Z02 = Z_{04} = 24.5$ ohms
$Z03 = 24.2$ ohms
$Ci, i+1$ same as above

EXAMPLE #3

490–720 Mhz Filer (39% Bandwidth)

470-690 MHz BW used in design equation
N=5
0.044 dB Ripple

Lumped Element values calculated
$C01 = C_{56} = 10.82$ pf
$C12 = C_{45} = 3.72$ pf
$C23 = C_{34} = 2.73$ pr
$C1 = C_5 = 5.15$ pf
$C2 = C_4 = 4.69$ pf
$C3 = 5.67$ pf
$Li = 7$ nH
$Zo = 50$ ohms
$f01 = f_{05} = 838.2$ MHz
$f02 = f_{04} = 878.4$ MHz
$f03 = 789.9$ MHz SIR Element values calculated $Ki32 \; 0.33, \; \theta oi = 30°@f_{oi}$
$Z01 = Z_{05} = 18.34$ ohms
$Z02 = Z_{04} = 19.15$ ohms
$Z03 = 17.55$ ohms
$Ci, i+1$ same as above A type of SIR for the bandpass filter for FIG. 2 has been constructed using a dielectric coaxial resonator. Such SIR is described in "A Design Method of Bandpass Filters Using Dielectric-Filled Coaxial Resonators", Sagawa, Makimoto, and Yamashita, *IEEE Transactions on Microwave Theory ant Techniques*, Vol. MTT-33, No. 2, Feb., 1985. The teachings of this article are hereby incorporated reference. The Sagawa SIR required tuning screws for all resonator elements, and could not be incorporated on a microstrip printed circuit board.

The preferred embodiment of the SIR of FIG. 2 uses a low cost, repeatable microstrip SIR. By using microstrip technology, the SIR may be accurately reproduced. This eliminates the need for tuning screws.

There is thus provided by the present invention a substantially improved capacitively coupled bandpass filter utilizing stepped impedance resonators. The use of lumped and distributed elements results in a compact capacitively coupled bandpass filter operating at UHF frequencies of 500 megahertz to 1 gigahertz and capable of wide bandwidths. The use of the stepped impedance resonators at these high frequencies allows for greater reproducibility and easy construction.

I claim:

1. A microstrip medium bandpass filter comprising:

a plurality of lumped element capacitor means;

a plurality of distributed microstrip stepped impedance resonator means wherein each of said plurality of distributed microstrip stepped impedance resonator means comprises:

first and second transmission line means of diverse impedance and of equal length;

said first transmission line means coupled to said plurality of lumped element capacitor means;

said first and second transmission line means coupled to each other in series;

said second transmission line means coupled to an electric ground; and said plurality of distributed microstrip stepped impedance resonator means coupled in parallel to each other by said plurality of lumped element capacitor means.

* * * * *